US008692466B2

(12) United States Patent
Benzerrouk et al.

(10) Patent No.: US 8,692,466 B2
(45) Date of Patent: Apr. 8, 2014

(54) METHOD AND APPARATUS OF PROVIDING POWER TO IGNITE AND SUSTAIN A PLASMA IN A REACTIVE GAS GENERATOR

(75) Inventors: Souheil Benzerrouk, Lowell, MA (US); Siddharth P. Nagarkatti, Acton, MA (US); Andrew Cowe, Andover, MA (US); Ali Shajii, Canton, MA (US); Jesse E. Ambrosina, Topsfield, MA (US); Ken Tran, North Chelmsford, MA (US); Xing Chen, Lexington, MA (US)

(73) Assignee: MKS Instruments Inc., Andover, MA (US)

( * ) Notice: Subject to any disclaimer, the term of this patent is extended or adjusted under 35 U.S.C. 154(b) by 635 days.

(21) Appl. No.: 12/394,904

(22) Filed: Feb. 27, 2009

(65) Prior Publication Data
US 2010/0219757 A1    Sep. 2, 2010

(51) Int. Cl.
H01J 7/24    (2006.01)

(52) U.S. Cl.
USPC .............................. 315/111.21; 315/111.51

(58) Field of Classification Search
USPC ....... 315/111.21, 111.41, 111.51, 226, 209 T, 315/308, 351, 360; 156/345.48
See application file for complete search history.

(56) References Cited

U.S. PATENT DOCUMENTS

| | | | |
|---|---|---|---|
| 4,600,563 A | 7/1986 | Diederich | 422/186.29 |
| 4,859,399 A | 8/1989 | Bussard | 376/133 |
| 5,303,139 A | 4/1994 | Mark | 363/63 |
| 5,394,061 A * | 2/1995 | Fujii | 315/111.21 |
| 5,414,238 A | 5/1995 | Steigerwald et al. | 219/121.54 |
| 5,474,648 A | 12/1995 | Patrick et al. | 156/627.1 |
| 5,556,549 A | 9/1996 | Patrick et al. | 216/61 |
| 5,621,331 A | 4/1997 | Smith et al. | 324/645 |
| 5,654,679 A | 8/1997 | Mavretic et al. | 333/17.3 |
| 5,712,592 A | 1/1998 | Stimson et al. | 330/124 R |
| 5,747,935 A * | 5/1998 | Porter et al. | 315/111.51 |
| 5,865,937 A | 2/1999 | Shan et al. | 156/345.44 |
| 6,150,628 A | 11/2000 | Smith et al. | 219/121.54 |
| 6,178,102 B1 | 1/2001 | Stanley | 363/44 |
| 6,225,592 B1 | 5/2001 | Doughty | 219/121.43 |
| 6,313,584 B1 * | 11/2001 | Johnson et al. | 315/111.21 |
| 6,388,226 B1 | 5/2002 | Smith et al. | 219/121.57 |
| 6,432,260 B1 | 8/2002 | Mahoney et al. | 156/345.35 |
| 6,486,431 B1 | 11/2002 | Smith et al. | 219/121.57 |
| 6,552,296 B2 | 4/2003 | Smith et al. | 219/121.43 |
| 6,559,408 B2 | 5/2003 | Smith et al. | 219/121.57 |

(Continued)

FOREIGN PATENT DOCUMENTS

DE    196 50 110    6/1998

OTHER PUBLICATIONS

PCT International Search Report, International Searching Authority, European Patent Office, Dec. 4, 2009, 7 pages.

(Continued)

*Primary Examiner* — Tung X Le
(74) *Attorney, Agent, or Firm* — Proskauer Rose LLP

(57) ABSTRACT

Described are methods and apparatuses, including computer program products, for igniting and/or sustaining a plasma in a reactive gas generator. Power is provided from an ignition power supply to a plasma ignition circuit. A pre-ignition signal of the plasma ignition circuit is measured. The power provided to the plasma ignition circuit is adjusted based on the measured pre-ignition signal and an adjustable pre-ignition control signal. The adjustable pre-ignition control signal is adjusted after a period of time has elapsed.

44 Claims, 8 Drawing Sheets

(56) References Cited

U.S. PATENT DOCUMENTS

| | | | |
|---|---|---|---|
| 6,586,887 B1* | 7/2003 | Oogoshi et al. | 315/111.41 |
| 6,664,497 B2 | 12/2003 | Smith et al. | 219/121.57 |
| 6,781,317 B1 | 8/2004 | Goodman | 315/111.21 |
| 6,791,274 B1* | 9/2004 | Hauer et al. | 315/111.21 |
| 6,815,633 B1 | 11/2004 | Chen et al. | 219/121.54 |
| 6,887,339 B1 | 5/2005 | Goodman et al. | 156/345.25 |
| 6,924,455 B1 | 8/2005 | Chen et al. | 219/121.41 |
| 7,353,771 B2 | 4/2008 | Millner et al. | 118/723 |
| 2004/0079287 A1 | 4/2004 | Smith et al. | 118/715 |
| 2005/0015965 A1 | 1/2005 | Maier et al. | 29/564 |
| 2005/0041446 A1 | 2/2005 | Harnett et al. | 363/95 |
| 2005/0057165 A1 | 3/2005 | Goodman | 315/111.51 |
| 2005/0093459 A1 | 5/2005 | Kishinevsky | 315/111.21 |
| 2005/0103439 A1 | 5/2005 | Goodman | 156/345.28 |
| 2005/0219875 A1 | 10/2005 | Millner et al. | 363/56.01 |
| 2006/0017388 A1* | 1/2006 | Stevenson | 315/111.51 |
| 2006/0279223 A1* | 12/2006 | Chistyakov | 315/111.51 |
| 2007/0056928 A1 | 3/2007 | Maeda et al. | |
| 2007/0103092 A1* | 5/2007 | Millner et al. | 315/276 |
| 2007/0181063 A1* | 8/2007 | Ritchie et al. | 118/723 E |

OTHER PUBLICATIONS

Abrie, Pieter L.D., "Design of RF and Microwave Amplifiers and Oscillators," Chapter 4, "Narrowband Impedance-Matching with LC Networks," pp. 125-149, Artech House, Inc., 2000. (22 pages).

Foutz, Jerrold, "Switching-Mode Power Supply Design," www.smpstech.com, Jan. 17, 2011 (3 pages).

Heckman, Randy et al., "The Evolution of RF Power Delivery in Plasma Processing," Advanced Energy Industries, Inc., 1998, (8 pages).

Kassakian, John G. et al., "Principles of Power Electronics," Addison-Wesley Publishing Co., Copyright 1991, pp. 1-8 from Chapter 1. (25 pages).

Lenk, John D., "Simplified Design of Switching Power Supplies," Butterworth-Heinemann, Chapter 1, "Switching Power-Supply Basics," p. 1 from Section 1.1, "Basic Switching-Regulator Functions," (4 pages).

Pressman, Abraham I., "Switching Power Supply Design," McGraw-Hill, Inc., p. xvii from the Preface (3 pages).

Advanced Energy, "Introducing Power Supplies and Plasma Systems," (pp. 1-8).

Advanced Energy, "Proven Power for High-Frequency, High-Power, Continuous-Use RF Sputtering Applications," "RFG and RFXII 13.56 MHZ 1250 W Power Supplies," Catalog, 1996, (4 pages).

"The Advanced Energy PE 2500 W, 100 kHz Generator with Load Matching," User Manual, Advanced Energy Industries, Inc., 1989 (60 pages).

"The World's Leading Authority on RF Power," RF Power Products, Inc., Catalog (3 pages).

Advanced Energy, Product Information, Copyright 2000 (22 pages).

RF Power Products, Inc., Product Information, date unknown (19 pages).

Cao, S.H., "Design Orientated Model and Application of Electronic Ballasts for Two Toroidal Ferrite Coupled Electrodeless Lamps," IEEE, pp. 1764-1769 (2005). (6 pages).

Miyazaki, Hideki, "High-Frequency Class-D Converter Driving with Feedback Capacitors for Electrodeless Fluorescent Lamps," IEEE, pp. 1033-1038 (2000). (6 pages).

Annex to Form PCT/ISA/206, Communication Relating to the Results of the Partial International Search, date of mailing Feb. 22, 2007. (7 pages).

International Search Report for International Application No. PCT/US2006/043046, Date of Mailing Aug. 9, 2007, including Written Opinion of the International Searching Authority 23 pages total).

Lenk, John D., "Simplified Design of Switching Power Supplies," Butterworth-Heinemann, Chapter 1, "Switching Power-Supply Basics," p. 1 from Section 1.1, "Basic Switching-Regulator Functions," bearing copyright 1995, 4 pages.

Pressman, Abraham I., "Switching Power Supply Design," McGraw-Hill, Inc., p. xvii from the Preface, Jul. 1991, 3 pages.

Advanced Energy, "Introducing Power Supplies and Plasma Systems," bearing copyright 1992, 8 pages.

"The World's Leading Authority on RF Power," RF Power Products, Inc. Catalog, believed to be available Apr. 1998, 3 pages.

RF Power Products, Inc., Product Information, believed to be available Apr. 1998, 19 pages.

* cited by examiner

METHOD AND APPARATUS OF PROVIDING POWER TO IGNITE AND SUSTAIN A PLASMA IN A REACTIVE GAS GENERATOR

FIELD OF THE INVENTION

The invention relates generally to the field of generating reactive gas containing ions, free radicals, atoms and molecules and to apparatuses for and methods of providing power for igniting and/or sustaining a plasma in a reactive gas generator.

BACKGROUND OF THE INVENTION

Plasma discharges can be used to excite gases to produce reactive gas containing ions, free radicals, atoms and molecules. Reactive gases are used for numerous industrial and scientific applications including processing solid materials such as semiconductor wafers, powders, and other gases.

One example of a reactive gas is atomic fluorine, which can be used to clean chemical vapor deposition (CVD) chambers for deposition of thin films onto substrate surfaces. CVD chambers need to be routinely cleaned to remove the deposits that build up on the surfaces of chamber parts other than the substrate surfaces. Wet cleaning of a chamber is labor intensive and hazardous to workers, while cleaning the chamber with atomic fluorine generated by a plasma source allows the deposits to be removed without opening the chamber to atmosphere, improving tool productivity and working conditions. Typical source gases for atomic fluorine include perfluorocompounds (PFCs) such as $NF_3$, $CF_4$, $CHF_3$, $C_2F_6$, and $C_4F_8$.

Another example of a reactive gas is atomic oxygen, which can be used for photoresist removal in microelectronics fabrication. After pattern generation, photoresist is removed by exposing the wafer surface to atomic oxygen generated by a plasma source. Atomic oxygen reacts rapidly and selectively with photoresist, allowing the process to be conducted in a vacuum and at relatively low temperature.

SUMMARY OF THE INVENTION

Plasma can be generated through inductive coupling of energy from a power supply into a gas that is capable of being transformed into a plasma. Known techniques for igniting a plasma include applying a high voltage or current to spark gaps to generate the initial breakdown of the pre-ionized gas. Known feedback techniques for detecting plasma ignition and sustaining the plasma include use of the plasma current as the feedback signal. In addition, known techniques for igniting and sustaining a plasma include the use of one power train for controlling multi-power train systems. However, such techniques are generally not reliable for the following reasons: arcing outside of the ignition window often occurs, punch through often occurs due to high loop and/or spark voltages, the operation is unreliable due to the use of one power train for control and monitoring, and large mismatches exist between impedances.

The invention features methods and power supplies that provide power to ignite and sustain a plasma in a reactive gas generator. Any of the particular embodiments described below can realize one or more of the following advantages. Embodiments can provide for a larger ignition space (e.g., a broader range of pressure and/or gas flows capable of igniting) with less complexity. In addition, embodiments can provide for a higher dQ/dt, which can allow for a large change of gas flow rate. Embodiments can eliminate or minimize the risk of anodization breakdown and punch-through. Embodiments can provide for reliable ignition and operation. Embodiments can increase block life. In addition, embodiments can provide for safe drop-out under all gas conditions.

In one aspect, there is a method of igniting a plasma in a reactive gas generator. The method includes providing power from an ignition power supply to a plasma ignition circuit, measuring a pre-ignition signal of the plasma ignition circuit, adjusting the power provided to the plasma ignition circuit based on the measured pre-ignition signal and an adjustable pre-ignition control signal, and adjusting the adjustable pre-ignition control signal after a period of time has elapsed.

In another aspect, there is a system of controlling the ignition of a plasma in a reactive gas generator. The system includes a measurement device coupled to a plasma ignition circuit and configured to generate a pre-ignition signal. The system also includes a controller. The controller includes a computing means for adjusting an ignition power supply control signal based on the pre-ignition signal and an adjustable pre-ignition control signal, an outputting means for outputting the ignition power supply control signal to an ignition power supply, and a computing means for adjusting the adjustable pre-ignition control signal after a period of time has elapsed.

In other examples, any of the aspects above can include one or more of the following features. The ignition power supply can include a switching power source. The ignition power supply can include a half-bridge inverter or a full-bridge inverter. The pre-ignition signal can include a voltage, current, or power of the plasma ignition circuit, or any combination thereof. The pre-ignition signal can include a current between the ignition power supply and the plasma ignition circuit. Measuring the pre-ignition signal can include measuring a peak of the pre-ignition signal during the period of time.

In some embodiments, adjusting the power provided to the plasma ignition circuit can include adjusting a duty cycle and/or a frequency value of the ignition power supply. Adjusting the power provided to the plasma ignition circuit can be based on the difference between the measured pre-ignition signal and the adjustable pre-ignition control signal. Adjusting the power provided to the plasma ignition circuit can include providing less power to the plasma ignition circuit if the measured pre-ignition signal is greater than the adjustable pre-ignition control signal, and providing more power to the plasma ignition circuit if the measured pre-ignition signal is less than the adjustable pre-ignition control signal.

In yet other embodiments, adjusting the adjustable pre-ignition control signal can include increasing the adjustable pre-ignition control signal after the period of time has elapsed. The adjustable pre-ignition control signal can be increased linearly with respect to time. Increasing the adjustable pre-ignition control signal can be bounded by a predetermined maximum control signal. The method can further include overriding the adjustment of the power provided to the plasma ignition circuit based on an override signal. The override signal can be based on a predetermined maximum control signal and the measured pre-ignition signal. Overriding the adjustment of the power provided to the plasma ignition circuit can include providing no power to the plasma ignition circuit during a second period of time.

In some embodiments, after an ignition period of time has elapsed, the method can further include adjusting the adjustable pre-ignition control signal to a reset value, maintaining the adjustable pre-ignition control signal at the reset value for a wait period of time, and adjusting the adjustable pre-ignition control after the wait period of time has elapsed. The plasma ignition circuit can include a transformer and a resonant circuit coupled to a primary winding of the transformer. The pre-ignition signal can include a voltage of the primary winding. The resonant circuit can include one or more inductors and one or more capacitors. The plasma ignition circuit can further include one or more ignition electrodes coupled to a secondary winding of the transformer. The secondary winding can include a center tap coupled to ground. The transformer can be electromagnetically coupled to a plasma chamber for providing power to a plasma in the plasma chamber.

In yet other embodiments, the method can further include determining whether the plasma is present in the plasma chamber, using the plasma ignition circuit to provide power from the ignition power supply to the plasma in the plasma chamber, and, if the plasma is determined to be present in the plasma chamber, adjusting the power provided to the plasma ignition circuit based on a plasma control signal. Adjusting the power provided to the plasma can include adjusting a duty cycle and/or a frequency value of the ignition power supply. Adjusting the power provided to the plasma can be based on the difference between the measured pre-ignition signal and the plasma control signal. The method can further include measuring a plasma signal, wherein adjusting the power provided to the plasma is based on the difference between a measured plasma signal and the plasma control signal. The plasma signal can include a current of the primary winding, a power supply signal, a plasma chamber signal, or any combination thereof.

In some embodiments, the system can further can include the ignition power supply and the plasma ignition circuit coupled to the ignition power supply. The measurement device can be further configured to generate the pre-ignition signal based on a voltage measurement, a current measurement, a power measurement, or any combination thereof, of the plasma ignition circuit. The measurement device can further includes a peak detection unit for measuring a peak of the measurement during the period of time. The computing means for adjusting the ignition power supply control signal can be configured to adjust the ignition power supply control signal based on the difference between the pre-ignition signal and the adjustable pre-ignition control signal. The computing means for adjusting the adjustable pre-ignition control signal can be configured to increase the adjustable pre-ignition control signal after the period of time has elapsed.

In yet other embodiments, the system can further include a plasma detection unit for detecting the presence of the plasma in the plasma chamber, and a power controller having a computing means for adjusting, if the plasma is determined to be present in the plasma chamber, power provided to the plasma ignition circuit based on a plasma control signal. The plasma control signal can include a predetermined plasma control value, a current of the primary winding, a power supply signal, a plasma chamber signal, or any combination thereof. The measurement device can be further coupled to one or more other plasma ignition circuits and can be configured to generate the pre-ignition signal based one measurements from the one or more other plasma ignition circuits. The outputting means for outputting the ignition power supply control signal can further includes means for outputting the ignition power supply control signal to one or more other ignition power supplies associated with the one or more other plasma ignition circuits.

In other examples, any of the features above relating to a method can be performed by a system, and/or a controller of the system, configured to or having means for performing the method. In addition, any of the features above relating to a method can be performed by a computer program product including instructions being operable to cause a data processing apparatus to perform the method.

BRIEF DESCRIPTION OF THE DRAWINGS

The advantages of the invention described above, together with further advantages, will be better understood by referring to the following description taken in conjunction with the accompanying drawings. The drawings are not necessarily to scale, emphasis instead generally being placed upon illustrating the principles of the invention.

DETAILED DESCRIPTION

The invention features methods and power supplies that provide power to ignite and sustain a plasma in a reactive gas generator. Any of the particular embodiments described below can realize one or more of the following advantages. Embodiments can provide for a larger ignition space (e.g., a broader range of pressure and/or gas flows capable of igniting) with less complexity. In addition, embodiments can provide for a higher dQ/dt, which can allow for a large change of gas flow rate. Embodiments can eliminate or minimize the risk of anodization breakdown and punch-through within the plasma chamber. Embodiments can provide for reliable ignition and operation. Embodiments can increase block life. In addition, embodiments can provide for safe drop-out under all gas conditions.

Figure 1:
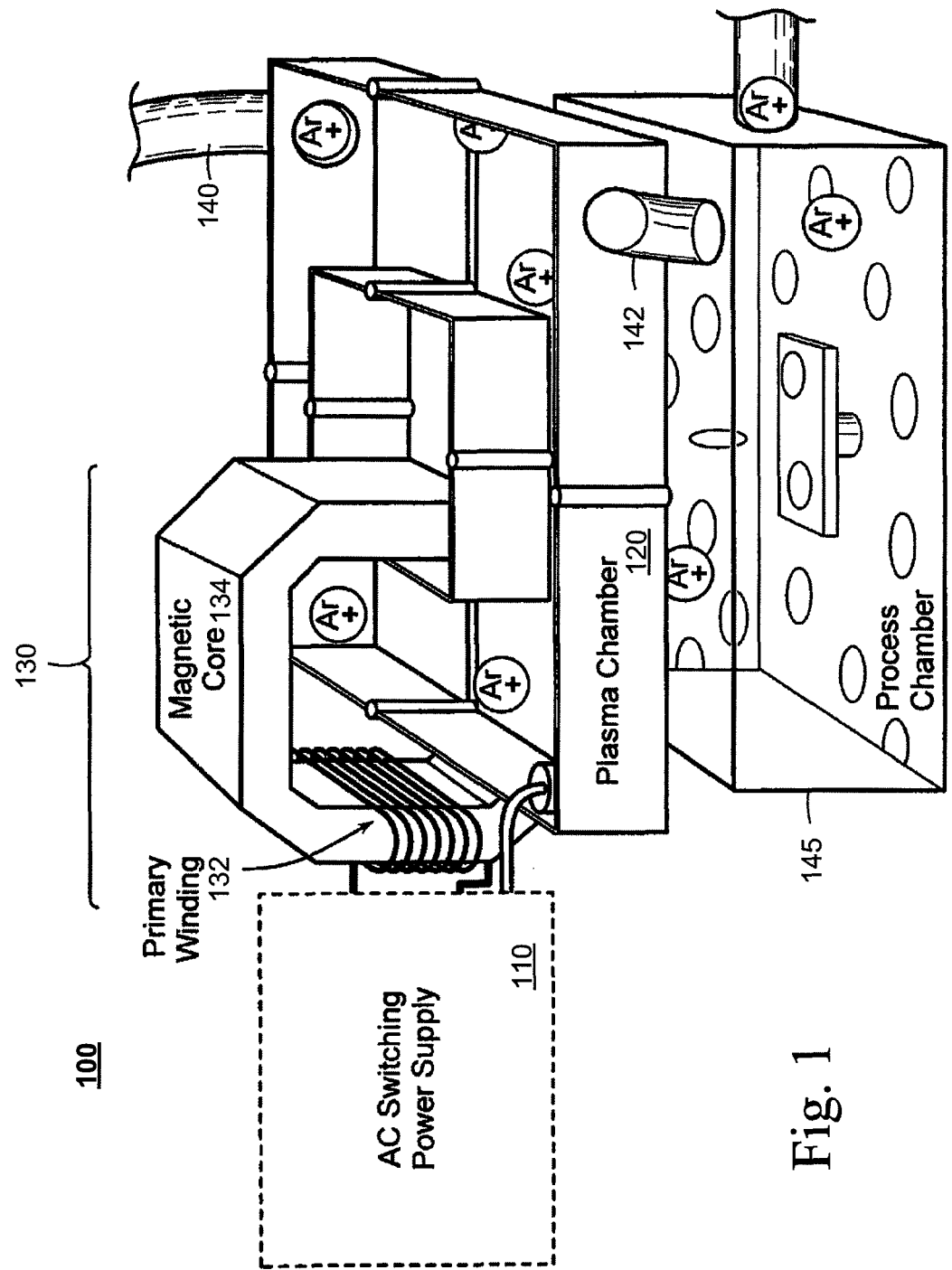
FIG. 1 is a diagram illustrating a reactive gas generator to which embodiments of the invention may be applied.

FIG. 1 is a diagram illustrating a reactive gas generator 100 to which embodiments of the invention can be applied. As illustrated, the reactive gas generator 100 includes a power supply 110 and a plasma chamber 120. The plasma chamber 120 includes an inlet 140 for receiving a gas (e.g., Argon) for transformation into a plasma (e.g., Ar+). Once generated, a plasma may be used directly, or can be used to excite one or more other source gases into corresponding reactive gases that exit the generator at outlet 142 and into, for example, a process chamber 145.

In order to ignite and/or sustain a plasma, the power supply 110 includes a transformer 130. The transformer primary includes a primary winding 132 wrapped about a portion of a magnetic core 134. Energy from the power supply 110 is inductively coupled via the transformer primary to the gas traveling through the chamber 120 to ignite, generate, and/or sustain the plasma. The ignited plasma within the plasma chamber 120 serves as the transformer secondary. Specifically, the power supply 110 applies an excitation voltage of high magnitude across the primary winding 132 of the transformer. This high excitation voltage induces high current in the winding 132, thereby generating an alternating magnetic field through the magnetic core 134 across a path of the gas. As a result, an electric field is induced within the gas, causing its ignition into a plasma and/or providing current to sustain the plasma. Once the plasma is generated, the plasma can be used to excite other source gas, producing a desired reactive gas for specific applications. The inner surface of the plasma chamber 120 can be coated and/or include an anodization layer (e.g., a dielectric material), for electrically isolating the plasma gas from the plasma chamber 120 itself.

Figure 2:
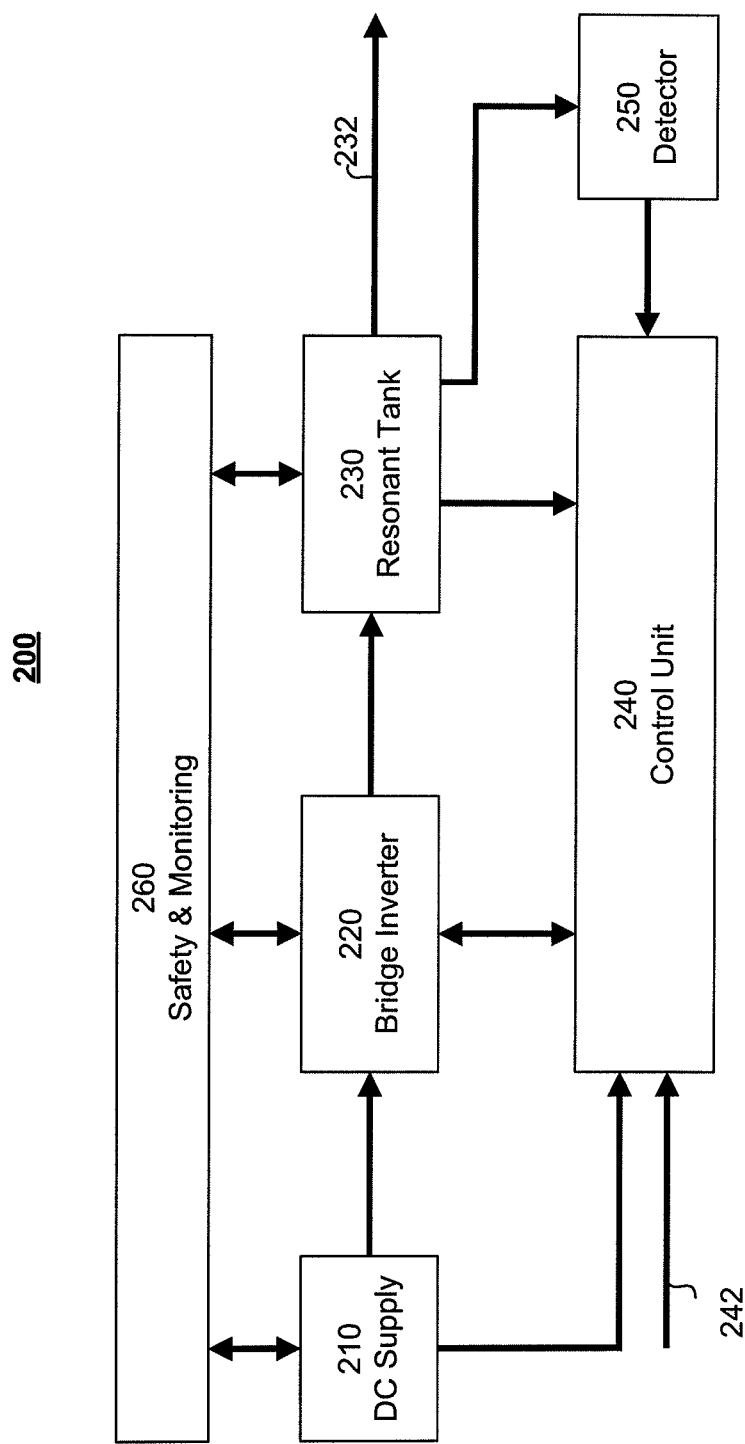
FIG. 2 is a block diagram illustrating a top-level control system for a power train.

FIG. 2 is a block diagram illustrating a top-level control system 200 for a power train. The system 200 can include a DC supply 210, a bridge inverter 220, a resonant tank 230, a frequency and duty cycle control unit 240, a plasma detection unit 250, and/or a safety and monitoring unit 260. The DC supply 210 can provide a DC power to the bridge inverter 220. The bridge inverter 220, in turn, can provide power to the resonant tank 230. The bridge inverter 220 can be a half bridge or a full bridge power converter as known in the art. Alternatively, any adjustable source of alternating current or voltage can be used in place of the DC supply 210 and the bridge inverter 220. The bridge inverter 220 can provide an alternating source signal having a frequency at or substantially at the resonant frequency of the resonant tank 230, which can include a resonant circuit. The resonant circuit can include one or more inductors and one or more capacitors. The resonant tank 230 can be inductively coupled via a transformer 232 to a plasma load (not shown) and/or to an plasma ignition unit (not shown). The frequency and duty cycle control unit 240 can control the frequency, duty cycle, and/or amplitude of the source signal provided by the bridge inverter 220 and DC supply 210. Control of the frequency and/or duty cycle by the unit 240 can be based on one or more signals measured from or provided by the DC supply 210, the bridge inverter 220, the resonant tank 230, the plasma detection unit 250, predetermined setpoint(s) 242, and/or any combination thereof. The plasma detection circuit 250 can detect the presence of a plasma based on one or more signals from the resonant tank 230 (e.g., inverter current and/or primary current) and/or one or more other signals from other units in the system (e.g., a plasma current or a power signal from the DC supply 210). The safety and monitoring unit 260 can provide one or more safety and monitoring functions to one or more of the units of the diagram 200. For example, in one embodiment, the safety and monitoring unit 260 can provide an override signal to the bridge inverter 220 to prevent the buildup of additional energy in the resonant tank 230.

Figure 3:
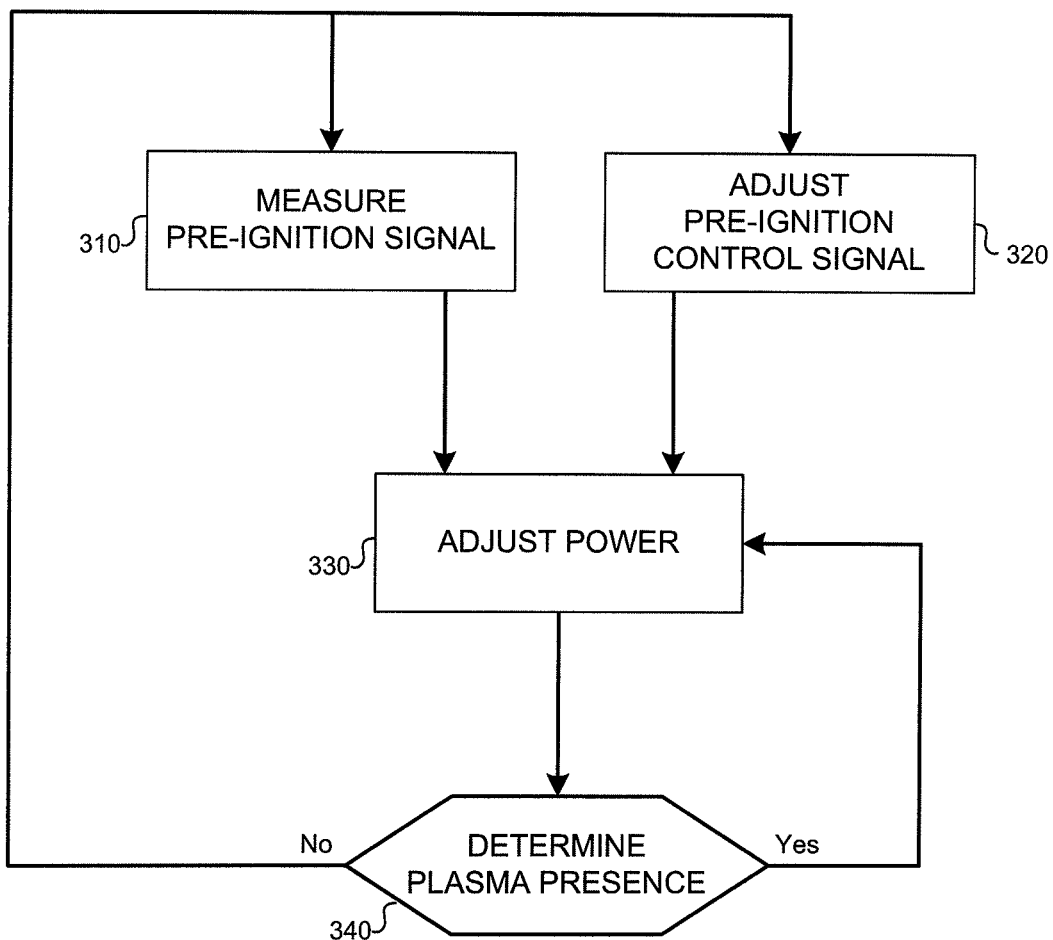
FIG. 3 is a flowchart depicting control of a power supply system to ignite and sustain a plasma in a reactive gas generator.

FIG. 3 is a flowchart 300 depicting control of a power supply system to ignite and sustain a plasma in a reactive gas generator. The elements of flowchart 300 are described using the exemplary block diagram 200 of FIG. 2. Control of the power supply system 210 includes measuring a pre-ignition signal by the frequency and duty cycle control unit 240 (310), adjusting, by the frequency and duty cycle control unit 240, a pre-ignition control signal (320), adjusting, by the bridge inverter 220, power provided to the resonant tank 230 (330), and/or determining the presence of a plasma by the detection unit 250 (340).

The pre-ignition signal can include, for example, a voltage, current, and/or power of the resonant tank 230. In one embodiment, the pre-ignition signal is a current (e.g., the inverter current) between the bridge inverter 220 and the resonant tank 230. In an alternative embodiment, the pre-ignition signal is a voltage (e.g., the voltage of the transformer's primary winding). Measuring the pre-ignition signal (310) can include determining a peak of the pre-ignition signal during a period of time (e.g., for every time period based on the time cycle of the alternating power source 220).

In a supplemental or alternative embodiment, measuring the pre-ignition signal (310) can include taking an average of the measured signal, filtering the measured signal, and/or other signal processing functions.

Adjusting the pre-ignition control signal (320) can be based on a predetermined pre-ignition control signal profile. In one embodiment, the predetermined pre-ignition control signal profile can include a ramp-up portion followed by a clamped portion. The ramp-up portion can be based on, for example, any monotonically increasing function of time F(t) (e.g., F(t)=at, where a>0 is a selected slope value), in which case adjusting the pre-ignition control signal includes evaluating the function F at a given time. In a supplemental embodiment, the predetermined pre-ignition control signal profile can include a delay period following the clamped portion.

Adjusting the power provided to the resonant tank 230 (330) can be based on the measured pre-ignition signal and the adjusted pre-ignition control signal. In one embodiment, the frequency and duty cycle control unit 240 can control the frequency and/or the duty cycle of the alternating source signal supplied by the bridge inverter 220. In a supplemental or alternative embodiment, the control unit 240 can also control the amplitude of the power signal using, for example, the DC supply 210. In another embodiment, adjusting the power (330) can be based on the difference between the measured pre-ignition signal and the adjustable pre-ignition control signal, in which less power can be provided if the measured pre-ignition signal is greater than the adjustable pre-ignition control signal and more power can be provided if the measured pre-ignition signal is less than the adjustable pre-ignition control signal.

Determining the presence of a plasma by the detection unit 250 (340) can be based on, for example, the primary current supplied to the transformer by the resonant tank 230. In an alternative or supplemental embodiment, the presence of a plasma can be based on a power signal from the DC supply 210 or an RF signal from the resonant tank 230. If a plasma is not detected, then the process can loop back to steps (310) and (320). If a plasma is detected, then the control unit 240 can enter into a plasma sustainability state, in which case the power provided to sustain the plasma can be adjusted to meet certain operating standards. In one embodiment, one or more elements of block diagram 200 can also be used to operate and provide power to the plasma chamber when a plasma is present.

Figure 4A:
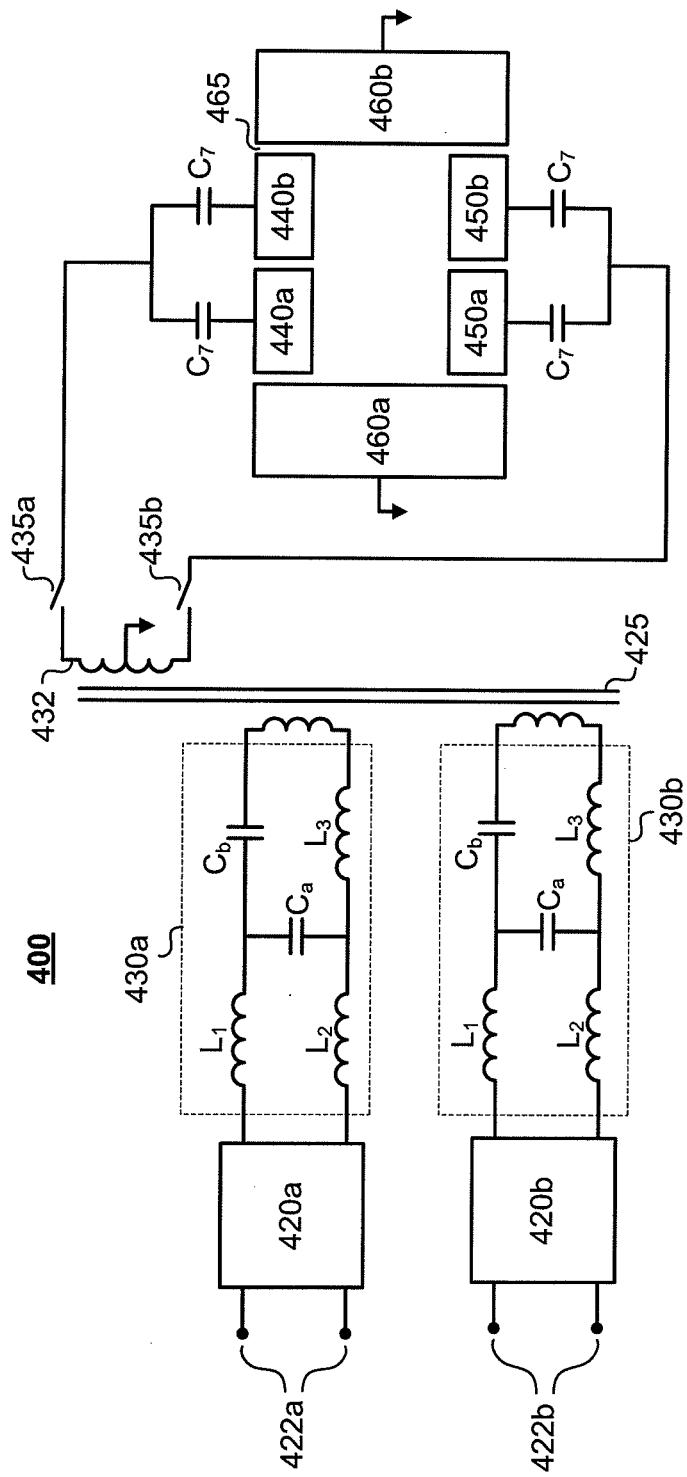
FIGS. 4A-B are circuit diagrams illustrating a power supply and block ignition circuit according to different embodiments.

FIG. 4A is a circuit diagram 400 illustrating a power supply and block ignition circuit according to one embodiment in which ignition occurs via ignition electrodes. While the circuit diagram 400 includes two modular power trains, other configurations with any number of modular power trains are possible. Each power train includes a power source 420a and 420b (e.g., an H-bridge) and a resonant circuit 430a and 430. The power sources 420a and 420b can be respectively coupled to, for example, DC sources 422a and 422b (e.g., 360 VDC). In the circuit diagram 400, the resonant circuits 430a and 430b include three inductors ($L_1$, $L_2$ and $L_3$) and two capacitors ($C_a$ and $C_b$), however other resonant configurations can also be used. In one embodiment, the values of the inductors $L_1$, $L_2$ and $L_3$ can be, respectively, 1.7 uH, 1.7 uH and 1.05 uH, and the values of the capacitors $C_a$ and $C_b$ can be, respectively, 55.6 nF and 37.6 uF. The resonant circuits 430a and 430b are coupled to a magnetic core 425.

The magnetic core 425 is coupled to a secondary plasma (not shown) and to a winding 432 wrapped about a portion of the magnetic core 425 of the transformer. When the power supplies 420a and 420b provide an excitation voltage across the primary winding, a current is induced within the winding 432 according to a turns ratio. The winding 432 can include a central ground tap, which results in the leads that extend from the winding being bipolar and thus enables the generation of positive and negative ignition electrodes. The leads of the winding 432 are switchably connected to one or more ignition electrodes 440a/440b and 450a/450b via, respectively, switches 435a and 435b. In addition, one or more capacitors $C_7$ can be placed between the winding 432 and the ignition electrodes 440a/440b and 450a/450b. The capacitors $C_7$ can have a value, for example, of 200 pF. Generally, the value of the capacitors $C_7$ can be chosen to limit the current to the ignition electrodes 440a/440b and 450a/450b such that charge buildup on the dielectrics is kept below predetermined levels.

The one or more ignition electrodes 440a/440b and 450a/450b can be arranged about or within the plasma chamber 120. By placing the positive and negative ignition electrodes such that they oppose one another in the plasma chamber 120, an increase in the amount of electric flux can be realized across the plasma chamber or channel. This can result in less voltage to ground being required to generate the requisite amount of electric flux to ignite the plasma gas. In one embodiment, the electrodes can be configured such that the electric field is generated across a channel of the plasma chamber 120. When the switches 435a and 435b are connected to the ignition electrodes 440a/440b and 450a/450b, an electric field is generated between the ignition electrodes 440a/440b, 450a/450b and/or ground electrodes 460a and 460b, which can initiate breakdown in the gases present in the chamber to thereby ignite a plasma.

During plasma ignition, one or both of the relays 435a and 435b are closed so that the voltage from the leads can be applied to the one or more ignition electrodes 440a/440b and 450a/450b. Once the plasma ignites, the relays 435a and 435b are opened, disabling the capacitive discharge. A typical arrangement of ignition electrodes can be such that they are positioned about a cross section of a plasma chamber or channel within the chamber. Specifically, ignition electrodes 440a/440b and 450a/450b can be positioned on opposing sides of the plasma chamber 120 and are switchably connected to the leads of the winding 432, resulting in both electrodes having the same polarity. Ground electrodes 460a and 460b can also be positioned on opposing sides of the plasma chamber or channel at an offset between the ignition electrodes 440a/440b and 450a/450b. Generally, any number of ignition electrodes can be placed throughout a plasma chamber. In one embodiment, the blocks of the plasma chamber 120 can serve as the ignition and ground electrodes.

Figure 4B:
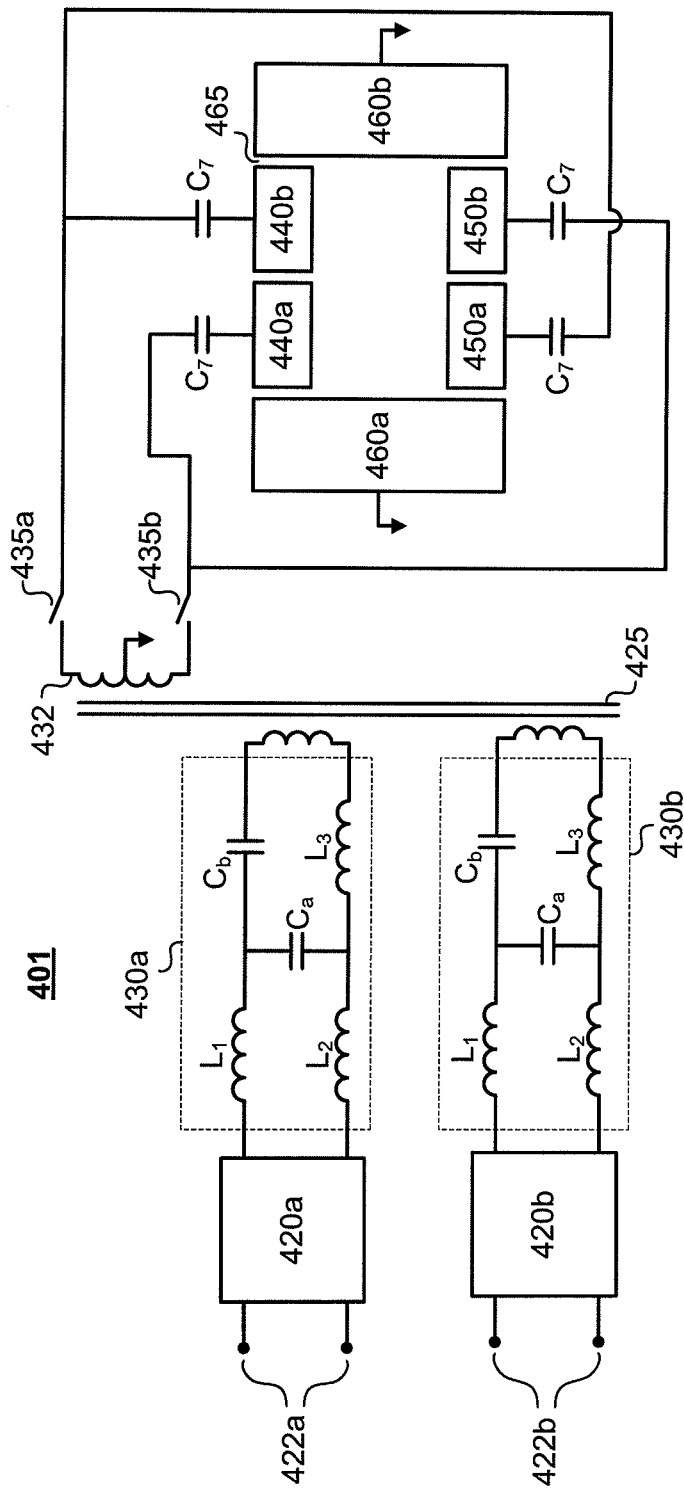

FIG. 4B is a circuit diagram 401 illustrating an alternative configuration for coupling the ignition electrodes 440a/440b and 450a/450b to the leads of winding 432. In particular, the ignition voltages are alternatively applied along a plasma channel in the circuit diagram 401. Generally, the ignition voltages and/or ground electrodes can be applied in any configuration to one or more ignition electrodes along a plasma channel. Based on the configuration, the volume in the plasma chamber that is covered by the applied electric field can be maximized while limiting the voltage of ignition electrodes to ground.

The dielectric separation between each of the electrodes can be represented as one or more capacitors $C_{dielec}$ 465. The voltage (denoted as $V_{spark}$) at one of the leads of winding 432 can be related to the voltage (denoted as $V_{dielec}$) at one of the ignition electrodes as follows:

$$V_{dielec} = \frac{Z_{dielec}}{Z_{dielec} + Z_7} V_{spark},$$

where $Z_7 = -j/(\omega C_7)$ and $Z_{dielec} = -j/(\omega C_{dielec})$.

Figure 5:
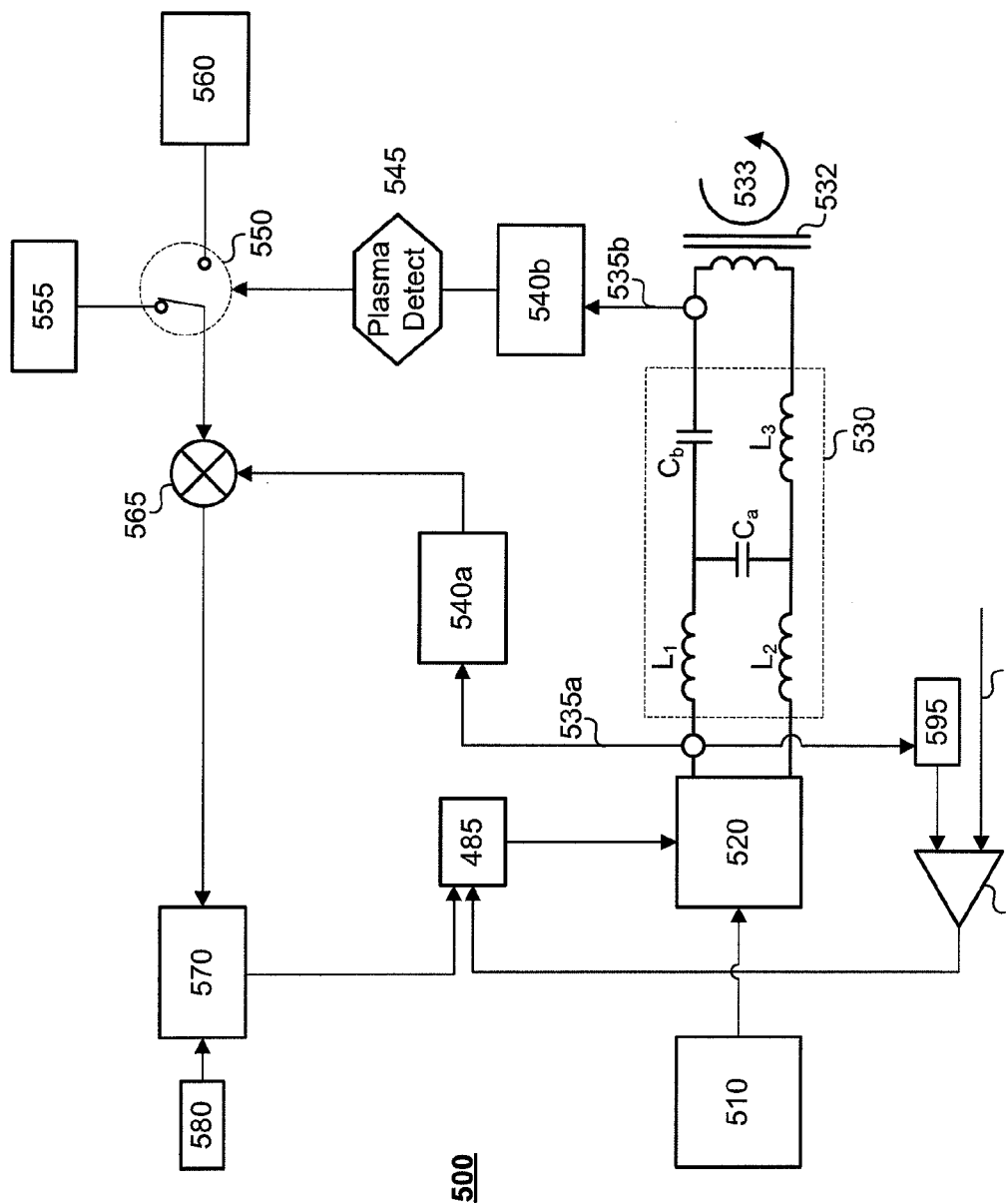
FIG. 5 is a block diagram illustrating a control system for a single power train according to one embodiment.

FIG. 5 is a block diagram illustrating a control system 500 for a single power train according to one embodiment. The elements of the control system 500 can be implemented, for example, with the circuit 400 of FIG. 4. The system 500 includes a DC supply 510, a bridge inverter 520 (e.g., a half or full bridge), a resonant circuit 530, and control components. The resonant circuit 530 is coupled to a magnetic core 532, which is coupled to a gas or plasma 533. The magnetic core 532 can also be coupled to a circuit of one or more ignition electrodes, as depicted in FIG. 4, and/or to other ignition circuits. The system also includes detection units 540a and 540b. Detection unit 540a can measure the peak inverter current 535a and can perform additional signal processing (e.g., filtering, averaging, and/or smoothing) if necessary. Detection unit 540b can measure the peak primary current 535 and can also perform additional signal processing if necessary. The output from detection unit 540b is provided to plasma detection unit 545. The plasma detection unit 545 can determine whether a plasma 533 has been ignited based on whether, for example, the measured primary current is greater than a predetermined threshold value.

The plasma detection unit 545 controls switch 550. In the absence of a plasma (e.g., during pre-ignition), the switch 550 latches to the pre-ignition control unit 555. The operation of the pre-ignition control unit 555 is described below with reference to FIGS. 6A-6C. In the presence of a plasma, the switch 550 latches to the post-ignition control unit 560. The operation of system 500 will first be described when the system is in the pre-ignition state (i.e., switch 550 is latched to the control unit 555).

The outputs from detection unit 540a and the pre-ignition control unit 555 are provided to comparator 565, which can take the difference between the two applied signals. The difference is, in turn, provided to a power supply control unit 570. In one embodiment, the power supply control unit 570 can include a PID control unit and a control chip. The power supply control unit 570 can determine adjustments to the frequency, the duty cycle, and/or other characteristics of the alternating signal supplied by the bridge inverter 520. For example, if the comparator 565 determines that the measured pre-ignition signal is greater than the pre-ignition control signal from unit 555, then the duty cycle can be decreased and/or the frequency shifted away from the resonant frequency of the resonant circuit 530. Likewise, if the comparator 565 determines that the measured pre-ignition signal is less than the pre-ignition control signal from unit 555, then the duty cycle can be increased and/or the frequency shifted towards from the resonant frequency of the resonant circuit 530. In a supplemental embodiment, the control unit 570 can be coupled to, or include, a hardware soft-start source 580.

The control signal from the control unit 570 can be coupled to the bridge inverter 520 via a programmable logic device 485. The programmable logic device 485 can be programmed to pass through the control signal in the absence of any override signal from the comparator 590. The comparator 590 can issue an override signal if it determines that a measurement signal 595 based on the inverter current is greater than a predetermined threshold value 596. The override mechanism thus established can advantageously provide a protection scheme for the system 500 for preventing unsafe energy levels from building up within the resonant circuit 530.

As described above, if a plasma is detected, the switch 550 latches to the post-ignition control unit 560. In one embodiment, the post-ignition control unit 560 can provide a predetermined inverter current control value based on the desired operating conditions of the plasma system. In this embodiment, the control unit 570 can adjust the power to the resonant circuit 530 such that the measured inverter current tracks the predetermined control value provided by the unit 560. In another embodiment, the post-ignition control unit 560 can include a PID control that outputs a signal based on the difference between the measured primary current 535*b* and a predetermined primary current control value based on the desired operating conditions of the plasma system. In yet another embodiment, the post-ignition control unit 560 can include a PID control that outputs a signal based on the difference between a measured power signal (not shown) and a predetermined power control value based on the desired operating conditions of the plasma system. The measured power signal can be, for example, provided by the DC supply 510 or from the other components of the system 500.

Figures 6A, 6B, 6C:
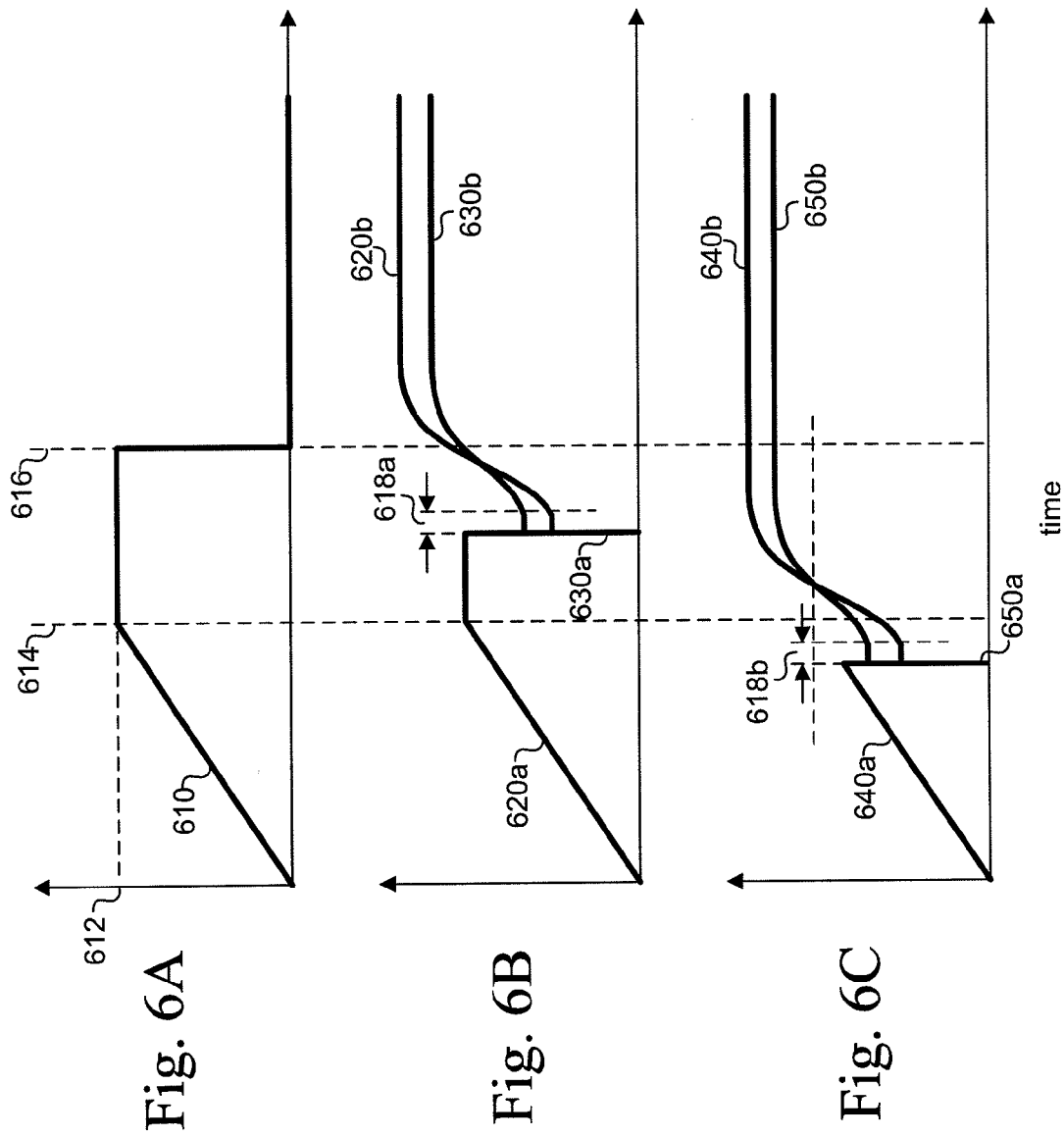
FIGS. 6A-6C are timing diagrams illustrating inverter and primary current values according to different ignition scenarios.

FIGS. 6A-6C are timing diagrams illustrating inverter and primary current values over time according to different ignition scenarios for a particular pre-ignition control signal generated by unit 555. In particular, the predetermined pre-ignition control signal profile generated by unit 555 is the same for FIGS. 6A-6C and corresponds to the signal 610 as described below. FIG. 6A illustrates an ignition failure scenario, in which no plasma ignites. FIG. 6B illustrates plasma ignition after a clamp threshold is reached. FIG. 6C illustrates plasma ignition prior to a clamp threshold being reached. As illustrated in FIG. 6A, the pre-ignition control signal 610 increases linearly during a ramp-up period of time 614, which can be, in one embodiment, about 20 ms. At time 614, the pre-ignition control signal 610 is bounded (i.e., clamped) at a threshold value 612. The threshold value 612 can be chosen to be below, for example, any value in which punch through is likely within the plasma chamber. Punch through can be dependent on choice of dielectric material, thickness of the dielectric material, geometry of the plasma chamber, and/or other characteristics of the plasma chamber and/or ignition circuit. Setting the threshold in such a fashion can therefore protect the anodization layer inside the plasma chamber from punch through. The pre-ignition control unit 555 maintains the signal 610 at the threshold value 612 for a predetermined amount of time 616, which can be, in one embodiment, about 100 ms. If no plasma is detected prior to time 616, the signal 610 resets to zero and the ramp up process starts over. In some embodiments, a delay period can be inserted after time 616 before the ramp up process starts again. In one embodiment, the delay period can be 400 ms. The following control values can be variably set and adjusted by the control system during operation based on desired operating conditions (e.g., based on different gas flow rates and/or types of gases): the threshold value 612, the ramp-up time 614, the reset time 616, and/or the delay period.

The signal 610 in FIG. 6A also can represent the measured inverter current 535*a* (or other corresponding pre-ignition signal) from the system, because the control unit 570 uses the feedback from the comparator 565 in order to have the inverter current 535*a* track the desired pre-ignition control profile 610 provided by the pre-ignition control unit 555. During pre-ignition, the primary current 535*b* is substantially zero and therefore is not illustrated in FIG. 6A.

The signals 620*a*/620*b* and 640*a*/640*b* in FIGS. 6B-6C can represent the measured inverter current 535*a* (or other corresponding pre-ignition signal), whereas the signals 630*a*/630*b* and 650*a*/650*b* can represent the measured primary current 535*b*. Prior to ignition, the primary currents 630*a* and 650*a* are substantially zero. In FIG. 6B, ignition occurs after time 614, whereas in FIG. 6C, ignition occurs prior to time 614.

As illustrated in FIGS. 6B-6C, when plasma ignition occurs, the inverters currents 620*a* and 640*a* initially drop in value and the primary currents 630*a* and 650*a* shoot up. In one embodiment, plasma detection occurs after the primary currents 630*a* and 650*a* have exceeded a detection threshold value for a period of time 618*a* and 618*b*. Upon plasma detection, the switch 550 latches on to the post-ignition control unit 560 which, in these illustrations, provides a control signal for the current higher than 612 in order to sustain the plasma. The system takes some amount of time before the inverter currents 620*b* and 640*b* stabilize at this value.

Figure 7:
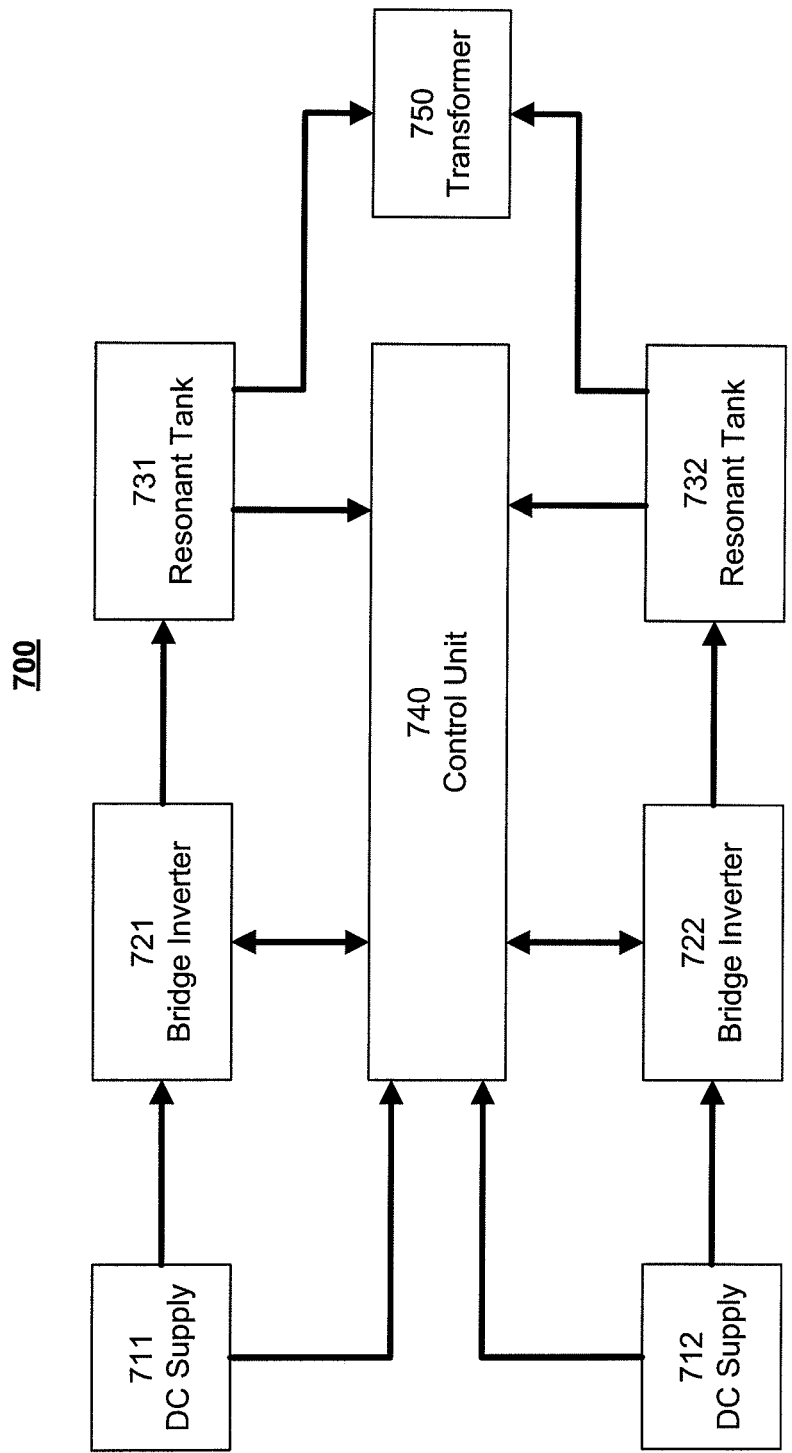
FIG. 7 is a block diagram illustrating a top-level control system for two power trains.

FIG. 7 is a block diagram illustrating a top-level control system 700 for two power trains that implement any of the above-mentioned features for a single power train system. While only two power trains are illustrated in FIG. 7, other configurations are possible for any number of power trains. The system 700 includes two DC supplies 711 and 712, two bridge inverters 721 and 722, two resonant tanks 731 and 732, one frequency and duty cycle control unit 740, one plasma detection unit 750, and/or a safety and monitoring unit (not shown). The control unit 740 is a multiple-input-single-output (MISO) control unit. For example, the output control signals to bridge inverters 721 and 722 are the same. In one embodiment, the output control signals provide frequency and/or duty cycle values for the bridge inverters 721 and 722. The inputs provided to the control unit 740 can include, for example, the mean, average, or rms values of the inverter currents (or other pre-ignition signals) from the resonant tanks 731 and 732. For example, detection unit 540*a* can output a pre-ignition control signal to comparator 565 that represents one or more inverter currents from one or more power trains. Providing a MISO control unit can advantageously decrease the complexity of the control circuitry required for multiple power train systems. In addition, providing a single output control can advantageously provide for greater control and stability of the overall system 700.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the invention by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit). Subroutines can refer to portions of the computer program and/or the processor/special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Information carriers suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The components of the computing system can be interconnected by a transmission medium, which can include any form or medium of digital or analog data communication (e.g., a communication network). The transmission medium can include one or more packet-based networks and/or one or more circuit-based networks in any configuration. Packet-based and/or circuit-based networks can include wireline and/or wireless networks.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed:

1. A method of igniting a plasma in a reactive gas generator, comprising:

providing power from an ignition power supply to a plasma ignition circuit;
measuring a pre-ignition signal of the plasma ignition circuit;
adjusting the power provided to the plasma ignition circuit based on the measured pre-ignition signal and an adjustable pre-ignition control signal; and
adjusting the adjustable pre-ignition control signal after a period of time has elapsed within an ignition wait time, the ignition wait time being a period of time during which the plasma is expected to ignite.

2. The method of claim 1 wherein the ignition power supply comprises a switching power source.

3. The method of claim 1 wherein the ignition power supply comprises a half-bridge inverter or a full-bridge inverter.

4. The method of claim 1 wherein the pre-ignition signal comprises a voltage, current, or power of the plasma ignition circuit, or any combination thereof.

5. The method of claim 1 wherein the pre-ignition signal comprises a current between the ignition power supply and the plasma ignition circuit.

6. The method of claim 1 wherein measuring the pre-ignition signal comprises measuring a peak of the pre-ignition signal during the period of time.

7. The method of claim 1 wherein adjusting the power provided to the plasma ignition circuit comprises adjusting a duty cycle and/or a frequency value of the ignition power supply.

8. The method of claim 1 wherein adjusting the power provided to the plasma ignition circuit is based on the difference between the measured pre-ignition signal and the adjustable pre-ignition control signal.

9. The method of claim 8 wherein adjusting the power provided to the plasma ignition circuit comprises:
providing less power to the plasma ignition circuit if the measured pre-ignition signal is greater than the adjustable pre-ignition control signal; and
providing more power to the plasma ignition circuit if the measured pre-ignition signal is less than the adjustable pre-ignition control signal.

10. The method of claim 1 wherein adjusting the adjustable pre-ignition control signal comprises increasing the adjustable pre-ignition control signal after the period of time has elapsed.

11. The method of claim 10 wherein the adjustable pre-ignition control signal is increased linearly with respect to time.

12. The method of claim 10 wherein increasing the adjustable pre-ignition control signal is bounded by a predetermined maximum control signal.

13. The method of claim 1 further comprising overriding the adjustment of the power provided to the plasma ignition circuit based on an override signal.

14. The method of claim 13 wherein the override signal is based on a predetermined maximum control signal and the measured pre-ignition signal.

15. The method of claim 13 wherein overriding the adjustment of the power provided to the plasma ignition circuit comprises providing no power to the plasma ignition circuit during a second period of time.

16. The method of claim 1, after an ignition period of time has elapsed, further comprising:
adjusting the adjustable pre-ignition control signal to a reset value;
maintaining the adjustable pre-ignition control signal at the reset value for a wait period of time; and adjusting the adjustable pre-ignition control after the wait period of time has elapsed.

17. The method of claim 1 wherein the plasma ignition circuit comprises a transformer and a resonant circuit coupled to a primary winding of the transformer.

18. The method of claim 17 wherein the pre-ignition signal comprises a voltage of the primary winding.

19. The method of claim 17 wherein the resonant circuit comprises one or more inductors and one or more capacitors.

20. The method of claim 17 wherein the plasma ignition circuit further comprises one or more ignition electrodes coupled to a secondary winding of the transformer.

21. The method of claim 20 wherein the secondary winding comprises a center tap coupled to ground.

22. The method of claim 17 wherein the transformer is electromagnetically coupled to a plasma chamber for providing power to a plasma in the plasma chamber.

23. The method of claim 22 further comprising:
determining whether the plasma is present in the plasma chamber;
using the plasma ignition circuit to provide power from the ignition power supply to the plasma in the plasma chamber; and
if the plasma is determined to be present in the plasma chamber, adjusting the power provided to the plasma ignition circuit based on a plasma control signal.

24. The method of claim 23 wherein adjusting the power provided to the plasma comprises adjusting a duty cycle and/or a frequency value of the ignition power supply.

25. The method of claim 23 wherein adjusting the power provided to the plasma is based on the difference between the measured pre-ignition signal and the plasma control signal.

26. The method of claim 23 further comprising measuring a plasma signal, wherein adjusting the power provided to the plasma is based on the difference between a measured plasma signal and the plasma control signal.

27. The method of claim 26 wherein the plasma signal comprises a current of the primary winding, a power supply signal, a plasma chamber signal, or any combination thereof.

28. A system of controlling the ignition of a plasma in a reactive gas generator, the system comprising:
a measurement device coupled to a plasma ignition circuit and configured to generate a pre-ignition signal;
a controller having:
(i) a computing means for adjusting an ignition power supply control signal based on the pre-ignition signal and an adjustable pre-ignition control signal;
(ii) an outputting means for outputting the ignition power supply control signal to an ignition power supply; and
(iii) a computing means for adjusting the adjustable pre-ignition control signal after a period of time has elapsed within an ignition wait time, the ignition wait time being a time duration during which the plasma is expected to ignite.

29. The system of claim 28 further comprising:
the ignition power supply; and
the plasma ignition circuit coupled to the ignition power supply.

30. The system of claim 29 wherein the ignition power supply comprises a half-bridge inverter or a full-bridge inverter.

31. The system of claim 28 wherein the measurement device is further configured to generate the pre-ignition signal based on a voltage measurement, a current measurement, a power measurement, or any combination thereof, of the plasma ignition circuit.

32. The system of claim 31 wherein the measurement device further comprises a peak detection unit for measuring a peak of the measurement during the period of time.

33. The system of claim 28 wherein the computing means for adjusting the ignition power supply control signal is configured to adjust the ignition power supply control signal based on the difference between the pre-ignition signal and the adjustable pre-ignition control signal.

34. The system of claim 28 wherein the computing means for adjusting the adjustable pre-ignition control signal is configured to increase the adjustable pre-ignition control signal after the period of time has elapsed.

35. The system of claim 34 wherein the increase in the adjustable pre-ignition control signal is bounded by a predetermined maximum control signal.

36. The system of claim 28 wherein the plasma ignition circuit comprises a transformer and a resonant circuit coupled to a primary winding of the transformer.

37. The system of claim 36 wherein the resonant circuit comprises one or more inductors and one or more capacitors.

38. The system of claim 36 wherein the plasma ignition circuit further comprises one or more ignition electrodes coupled to a secondary winding of the transformer.

39. The system of claim 38 wherein the secondary winding comprises a center tap coupled to ground.

40. The system of claim 36 wherein the transformer is electromagnetically coupled to a plasma chamber for providing power to a plasma in the plasma chamber.

41. The system of claim 28 further comprising:
a plasma detection unit for detecting the presence of the plasma in the plasma chamber; and
a power controller having a computing means for adjusting, if the plasma is determined to be present in the plasma chamber, power provided to the plasma ignition circuit based on a plasma control signal.

42. The system of claim 41 wherein the plasma control signal comprises a predetermined plasma control value, a current of the primary winding, a power supply signal, a plasma chamber signal, or any combination thereof.

43. The system of claim 28 wherein the measurement device is further coupled to one or more other plasma ignition circuits and is configured to generate the pre-ignition signal based one measurements from the one or more other plasma ignition circuits.

44. The system of claim 43 wherein the outputting means for outputting the ignition power supply control signal further comprises means for outputting the ignition power supply control signal to one or more other ignition power supplies associated with the one or more other plasma ignition circuits.

* * * * *